United States Patent
Yoo

(10) Patent No.: US 11,165,405 B2
(45) Date of Patent: Nov. 2, 2021

(54) DIPLEXER HAVING LOW BAND FILTER AND HIGH BAND FILTER

(71) Applicant: Dialog Semiconductor Korea Inc., Seongnam-si (KR)

(72) Inventor: Hee Yong Yoo, Seongnam-si (KR)

(73) Assignee: Dialog Semiconductor Korea Inc., Seoul (KR)

( * ) Notice: Subject to any disclaimer, the term of this patent is extended or adjusted under 35 U.S.C. 154(b) by 0 days.

(21) Appl. No.: 16/699,656

(22) Filed: Dec. 1, 2019

(65) Prior Publication Data

US 2020/0321936 A1 Oct. 8, 2020

(30) Foreign Application Priority Data

Apr. 4, 2019 (KR) .................... 10-2019-0039661

(51) Int. Cl.
*H03H 7/46* (2006.01)
*H03H 7/01* (2006.01)

(52) U.S. Cl.
CPC .......... *H03H 7/461* (2013.01); *H03H 7/0115* (2013.01); *H03H 7/1725* (2013.01); *H03H 2007/013* (2013.01)

(58) Field of Classification Search
CPC . H03H 7/461; H03H 7/1725; H03H 2007/013
USPC .................................................. 333/110, 175
See application file for complete search history.

(56) References Cited

U.S. PATENT DOCUMENTS

2004/0217914 A1* 11/2004 Yamashita ............. H04B 1/406
  343/850
2006/0006960 A1* 1/2006 Lin ........................ H03H 7/463
  333/132

FOREIGN PATENT DOCUMENTS

JP 2005-244583 A 9/2005
JP 2018-129683 A 8/2018

OTHER PUBLICATIONS

Korean Office Action, Application No. 10-2019-0039661, Applicant: Dialog Semiconductor Korea Inc., dated Jun. 19, 2020, 7 pages.

* cited by examiner

*Primary Examiner* — Rakesh B Patel
(74) *Attorney, Agent, or Firm* — Saile Ackerman LLC; Stephen B. Ackerman

(57) ABSTRACT

A diplexer having a low band filter and a high band filter is disclosed. The disclosure provides a diplexer having a low band filter and a high band filter for preventing the circuit damage due to an electrostatic discharge in the diplexer itself, and minimizing the signal loss according to addition of an electrostatic discharge prevention circuit.

9 Claims, 5 Drawing Sheets

(a)

(b)

DIPLEXER HAVING LOW BAND FILTER AND HIGH BAND FILTER

RELATED APPLICATION

This application claims the benefit of priority of Korean Patent Application No. 10-2019-0039661 filed on Apr. 4, 2019, the contents of which are incorporated herein by reference in their entirety.

FIELD AND BACKGROUND OF THE INVENTION

The disclosure relates to a diplexer having a low band filter and a high band filter.

The below information is presented as background information only to assist in understanding of an embodiment of the disclosure. No determination has been made, and no assertion is made, as to whether any of the below might be applicable as prior art with regard to the disclosure.

In recent years, a wireless signal processing apparatuses have been widely used due to convenience of use, simplicity of portability and the like. From among wireless signal processing apparatuses, there is a wireless local area network (LAN) which is capable of being connected in a particular region via a network and performing the Internet and the like.

The wireless LAN is mainly used in a mobile phone, a notebook PC and the like, so that mobility and network accessibility may be facilitated. The wireless LAN, when transmitting and receiving a wireless signal, employs a diplexer separating a signal amplified at a transmitting terminal into previously-set frequency bands, and transmitting the separated signal. In particular, as a demand for applying various communication schemes to one device increases, a diplexer used in a plurality of frequency bands has been used in various fields.

As the diplexer is used in various fields, various requirements arise due to a use environment of the diplexer. An important issue of the diplexer is that it has good characteristics for electrostatic discharge (ESD).

Generally, it is general to apply an antistatic technology to a wireless communication apparatus, but a method for preventing an electrostatic discharge in the diplexer itself or improving the characteristics according to it and thus, there is a problem that the performance is deteriorated by the electrostatic discharge.

SUMMARY OF THE INVENTION

The disclosure is to provide a diplexer having a low band filter and a high band filter. The diplexer prevents a circuit damage caused by an electrostatic discharge in a diplexer itself, and minimizes a signal loss due to addition of an electrostatic discharge circuit.

According to an aspect of the disclosure, a diplexer is provided. The diplexer includes a low pass filter (LPF) to pass only a preset low band signal from among signals input from an antenna (ANT) to a low frequency path, and output the passed low band signal to a low frequency signal input/output terminal (LB IN/OUT), a high band stop filter (BSF) connected between the antenna (ANT) and the low pass filter (LPF), and sharing a current inducing element within the low pass filter (LPF) and blocking a specific preset high band signal from among signals input to the low frequency path, a high pass filter (HPF) to pass only a preset high band signal from among signals input from the antenna (ANT) to a high frequency path, and output the passed high band signal to a high frequency signal input/output terminal (HB IN/OUT), a low band stop filter (BSF) connected between the antenna (ANT) and the high pass filter (HPF), and sharing any one of charge/discharge elements within the high pass filter (HPF) and blocking a specific preset low band signal from among signals input to the high frequency path, and an electrostatic discharge protection circuit (ESD) connected between the high pass filter (HPF) and the low band stop filter (BSF), and discharging an electrostatic discharge input to the high frequency path to an electrostatic discharge protection path formed by sharing a current inducing element within the low band stop filter (BSF) and a current inducing element within the high pass filter (HPF).

As described above, an embodiment of the disclosure has an effect to provide a diplexer having a low band filter and a high band filter. The diplexer prevents a circuit damage caused by an electrostatic discharge in a diplexer itself, and minimizes a signal loss due to addition of an electrostatic discharge circuit.

An embodiment of the disclosure has an effect to provide a diplexer including a notch filter and a function of protecting electrostatic discharge (ESD). An embodiment of the disclosure has an effect to connect a diplexer to an RF switch and implement a front-end module (FEM) including a power amplifier (PA) and a low-noise amplifier (LNA).

DESCRIPTION OF SPECIFIC EMBODIMENTS OF THE INVENTION

Embodiments will now be explained in detail with reference to the accompanying drawings.

Figure 1:
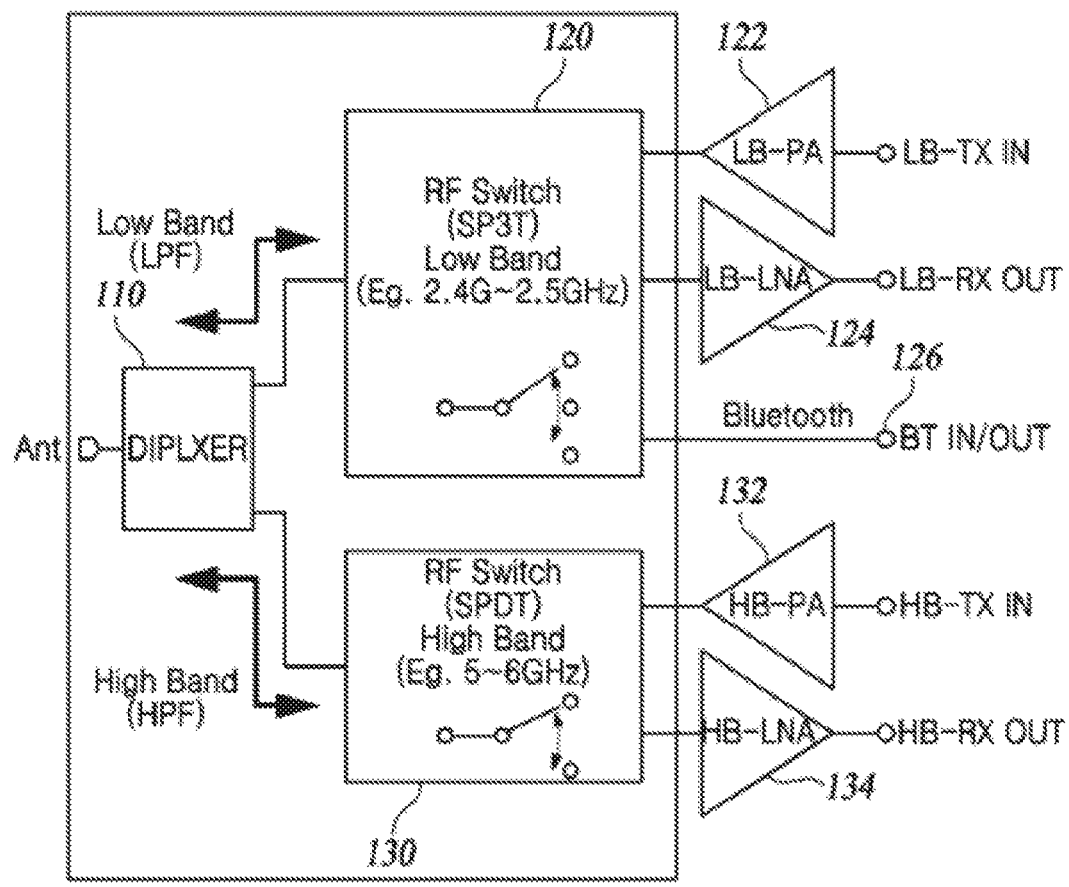
FIG. 1 is a block diagram illustrating a brief configuration of a front-end module (FEM), according to an embodiment of the disclosure.

FIG. 1 is a block diagram illustrating a brief configuration of a front-end module (FEM), according to an embodiment of the disclosure.

An FEM according to an embodiment includes a diplexer 110, a low band RF switch 120 and a high band RF switch 130.

The diplexer 110 refers to a branching filter element which is used to transmit and receive two signals of different frequencies by one antenna (ANT).

The antenna (ANT) terminal of the diplexer 110 is connected to an antenna and a matching circuit related to the antenna. A low frequency signal input/output terminal (LB IN/OUT) of the diplexer 110 is connected to an input/output terminal of the low band RF switch 120. A high frequency signal input/output terminal (HB IN/OUT) of the diplexer 110 is connected to an input/output terminal of the high band RF switch 130.

The diplexer 110 transmits and receives two signals of different frequencies from one antenna (ANT). The diplexer 110, when receiving a signal, separates a low band frequency from a signal received from the one antenna (ANT) and inputs the separated low band frequency to the low band RF switch 120. The diplexer 110 separates a high band frequency from a signal received from the one antenna (ANT) and inputs the separated high band frequency to the high band RF switch 130.

The diplexer 110, when transmitting a signal, inputs a low band signal output from the low band RF switch 120 to a low frequency signal input/output terminal (LB IN/OUT) of the diplexer 110. The diplexer 110 transmits the low band signal output from the low band RF switch 120 to the antenna (ANT). The diplexer 110 inputs a high band signal output from the high band RF switch 130 to a high frequency signal input/output terminal (HB IN/OUT) of the diplexer 110. The diplexer 110 transmits the high band signal output from the high band RF switch 130 to the antenna (ANT).

The diplexer 110, when using two types of band frequencies as one antenna (ANT), separates a signal of two bands received from an antenna (ANT) port and inputs the separated signal to a low band circuit or a high band circuit, or conversely, collects a signal output from the low band circuit or the high band circuit and transmits the collected signal. The diplexer 110 processes a signal of lower bands from among signals input or output from the one antenna (ANT) by the low band filter 410, and processes a signal of higher bands by the high band filter 420. The diplexer 110, in a Wi-Fi band, uses a frequency band of approximately 2.4 to 2.5 GHz as a low band, and uses a frequency band of approximately 4.9 to 5.9 GHz as a high band.

An input terminal of the low band RF switch 120 is connected to one end on the input/output side (low frequency signal input/output terminal (LB IN/OUT)) of the diplexer 110. An output terminal of the low band RF switch 120 (LB-TX OUT) is connected to an output terminal of a low band power amplifier (LB-PA) 122. An output terminal of the low band RF switch 120 (LB-RX OUT) is connected to an input terminal of a low band low-noise amplifier (LB-LNA) 124. The other end on the input/output side of the low band RF switch 120 is connected to a Bluetooth input/output terminal 126.

The low band RF switch 120 performs switching so that a transmitting signal is input from the LB-PA 122 and transmitted to the diplexer 110 or that a receiving signal is input from the diplexer 110 and output to the LB-LNA 124.

An input terminal of the high band RF switch 130 is connected to the other end on the input/output side (high frequency signal input/output terminal (HB IN/OUT)) of the diplexer 110. One end on the output side of the high band RF switch 130 (HB-TX IN) is connected to an output terminal of a high band power amplifier (HP-PA) 132. The other end on the output side of the high band RF switch 130 (HB-RX OUT) is connected to an input terminal of a high band low-noise amplifier (HB-LNA) 134.

Figure 2:
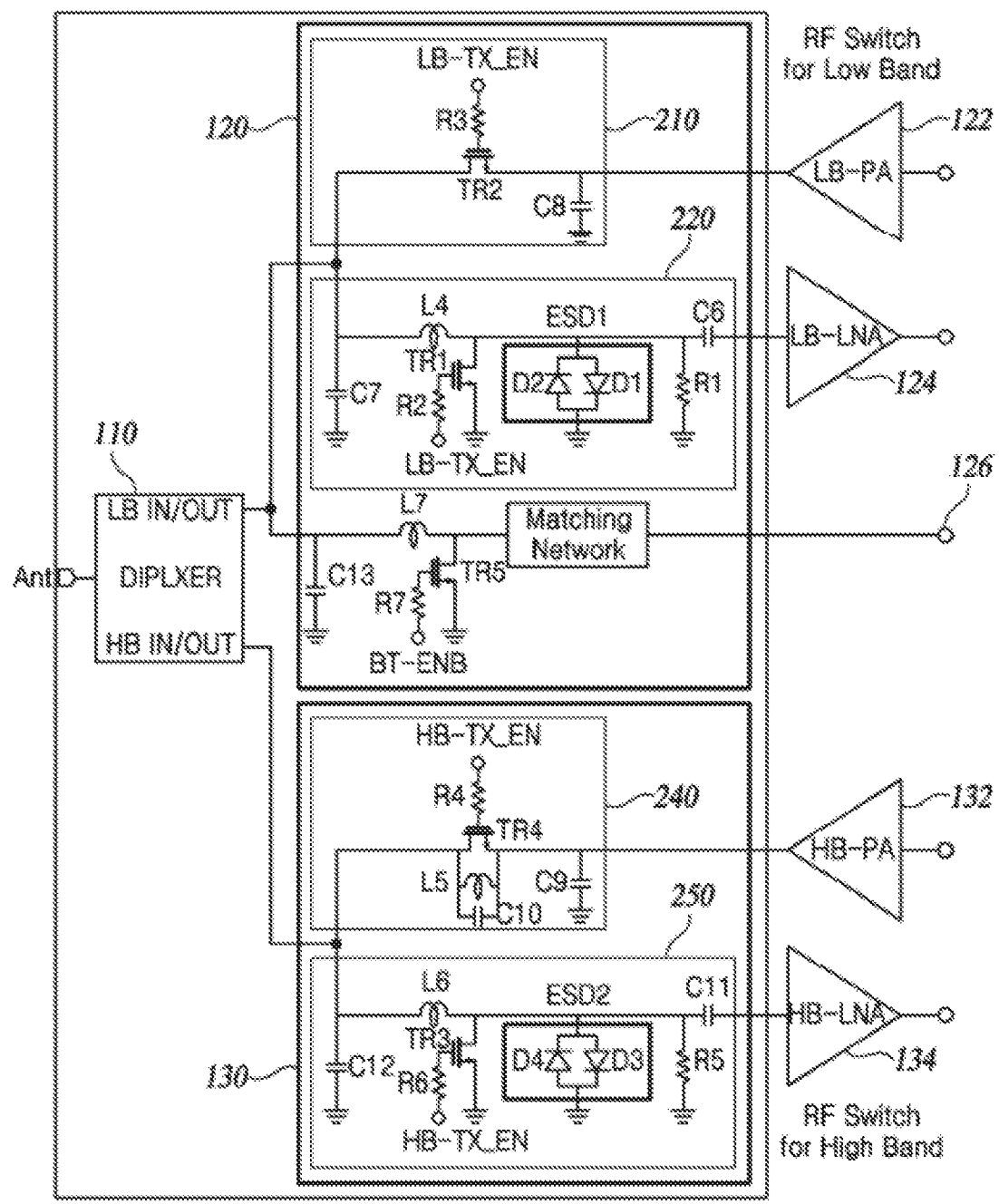
FIG. 2 is a circuit diagram illustrating a low band RF switch and a high band RF switch, according to an embodiment of the disclosure.

FIG. 2 is a circuit diagram illustrating a low band RF switch and a high band RF switch, according to an embodiment of the disclosure.

The low band RF switch 120 according to an embodiment of the disclosure includes a low band transmitting circuit 210, a low band receiving circuit 220 and a Bluetooth path. The elements included in the low band RF switch 120 are not necessarily limited thereto.

The low band transmitting circuit 210 according to an embodiment of the disclosure includes a third resistance (R3), a second switch (TR2) and an eighth capacitor (C8). The elements included in the low band transmitting circuit 210 are not necessarily limited thereto.

One end of the third resistance (R3) is connected to an enable terminal of a low band transmitting terminal (LB-TX_EN). The other end of the third resistance (R3) is connected to an input terminal of the second switch (TR2).

A current input terminal of the second switch (TR2) is connected to one end on the input/output side (low frequency signal input/output terminal (LB IN/OUT)) of the diplexer 110. An input terminal of the second switch (TR2) is connected to the other end of the third resistance (R3). A current lead-out terminal of the second switch (TR2) is connected to a contact point of one end of the eighth capacitor (C8) and an output terminal of the LB-PA 122.

One end of the eighth capacitor (C8) is connected to a contact point of the current lead-out terminal of the second switch (TR2) and the output terminal of the LB-PA 122. The other end of the eighth capacitor (C8) is connected to a ground (GND).

The low band receiving circuit 220 according to an embodiment of the disclosure includes a sixth capacitor (C6), a first resistance (R1), a first electrostatic discharge (ESD) circuit (ESD1), a first switch (TR1), a second resistance (R2), a fourth inductor (L4) and a seventh capacitor (C7). The elements included in the low band receiving circuit 220 are not necessarily limited thereto.

One end of the seventh capacitor (C7) is connected to one end on the input/output side (low frequency signal input/output terminal (LB IN/OUT)) of the diplexer 110. The other end of the seventh capacitor (C7) is connected to a ground (GND).

One end of the fourth inductor (L4) is connected to a contact point of one end on the input/output side (low frequency signal input/output terminal (LB IN/OUT)) of the diplexer 110 and one end of the seventh capacitor (C7). The other end of the fourth inductor (L4) is connected to a contact point of the current input terminal of the first switch (TR1) and the input terminal of the first electrostatic discharge circuit (ESD1).

The current input terminal of the first switch (TR1) is connected to a contact point of the other end of the fourth inductor (L4) and the input terminal of the first electrostatic discharge circuit (ESD1). The input terminal of the first switch (TR1) is connected to one end of the second resistance (R2). The current lead-out terminal of the first switch (TR1) is connected to a ground (GND).

One end of the second resistance (R2) is connected to the input terminal of the first switch (TR1). The other end of the second resistance (R2) is connected to an enable terminal of the low band transmitting terminal (LB-TX_EN).

The input terminal of the first electrostatic discharge circuit (ESD1) is connected to a contact point of the other end of the fourth inductor (L4) and one end of the sixth capacitor (C6). The output terminal of the first electrostatic discharge circuit (ESD1) is connected to a ground (GND).

The first electrostatic discharge circuit (ESD1) includes a first diode (D1) and a second diode (D2).

The input terminal of the first electrostatic discharge circuit (ESD1) is connected to a contact point of an anode of the first diode (D1) and a cathode of the second diode (D2). The anode of the first diode (D1) is connected to the cathode of the second diode (D2). A cathode of the first diode (D1) is connected to an anode of the second diode (D2).

The output terminal of the first electrostatic discharge circuit (ESD1) is connected to a contact point of the cathode of the first diode (D1) and the anode of the second diode (D2). The anode of the second diode (D2) is connected to the cathode of the first diode (D1). The cathode of the second diode (D2) is connected to the anode of the first diode (D1).

One end of the first resistance (R1) is connected to a contact point of the input terminal of the first electrostatic discharge circuit (ESD1) and one end of the sixth capacitor (C6). The other end of the first resistance (R1) is connected to a ground (GND).

One end of the sixth capacitor (C6) is connected to a contact point of the input terminal of the first electrostatic discharge circuit (ESD1) and one end of the first resistance (R1). The other end of the sixth capacitor (C6) is connected to the input terminal of the LB-LNA 124.

One end of the Bluetooth path is connected to one end on the input/output side (low frequency signal input/output terminal (LB IN/OUT)) of the diplexer 110. The other end of the Bluetooth path is connected to the Bluetooth input/output terminal 126.

The Bluetooth path includes a 13th capacitor (C13), a seventh inductor (L7), a fifth switch (TR5), a seventh resistance (R7) and a matching network circuit.

One end of the 13th capacitor (C13) is connected to one end on the input/output side (low frequency signal input/output terminal (LB IN/OUT)) of the diplexer 110. The other end of the 13th capacitor (C13) is connected to a ground (GND).

One end of the seventh inductor (L7) is connected to a contact point of one end on the input/output side (low frequency signal input/output terminal (LB IN/OUT)) of the diplexer 110 and the one end of the 13th capacitor (C13). The other end of the seventh inductor (L7) is connected to a contact point of the current input terminal of the fifth switch (TR5) and one end of the matching network circuit.

The current input terminal of the fifth switch (TR5) is connected to a contact point of the other end of the seventh inductor (L7) and one end of the matching network circuit. The input terminal of the fifth switch (TR5) is connected to one end of the seventh resistance (R7). The current lead-out terminal of the fifth switch (TR5) is connected to a ground (GND).

One end of the seventh resistance (R7) is connected to the input terminal of the fifth switch (TR5). The other end of the seventh resistance (R7) is connected to a Bluetooth enable terminal (BT_EN).

One end of the matching network circuit is connected to a contact point of the other end of the seventh inductor (L7) and the current input terminal of the fifth switch (TR5). The other end of the matching network circuit is connected to the Bluetooth input/output terminal 126.

The high band RF switch 130 according to an embodiment of the disclosure includes a high band transmitting circuit 240 and a high band receiving circuit 250. The elements included in the high band RF switch 130 are not necessarily limited thereto.

The high band transmitting circuit 240 according to an embodiment of the disclosure includes a ninth capacitor (C9), a fifth inductor (L5), a tenth capacitor (C10), a fourth switch (TR4) and a fourth resistance (R4). The elements included in the high band transmitting circuit 240 are not necessarily limited thereto.

One end of the fourth resistance (R4) is connected to an enable terminal of the high band transmitting terminal (HB-TX_EN). The other end of the fourth resistance (R4) is connected to an input terminal of the fourth switch (TR4).

A current input terminal of the fourth switch (TR4) is connected to the other end on the input/output side (high frequency signal input/output terminal (HB IN/OUT)) of the diplexer 110. An input terminal of the fourth switch (TR4) is connected to the other end of the fourth resistance (R4).

A current lead-out terminal of the fourth switch (TR4) is connected to the output terminal of the HB-PA 132.

One end of the fifth inductor (L5) is connected to the current lead-out terminal of the fourth switch (TR4). The other end of the fifth inductor (L5) is connected to the current input terminal of the fourth switch (TR4).

One end of the tenth capacitor (C10) is connected to one end of the fifth inductor (L5). The other end of the tenth capacitor (C10) is connected to the other end of the fifth inductor (L5).

One end of the ninth capacitor (C9) is connected to a contact point of the current lead-out terminal of the fourth switch (TR4) and the output terminal of the HB-PA 132. The other end of the ninth capacitor (C9) is connected to a ground (GND).

The high band receiving circuit 250 according to an embodiment of the disclosure includes an eleventh capacitor C11, a fifth resistance (R5), a second electrostatic discharge circuit (ESD2), a sixth inductor (L6), a third switch (TR3), a sixth resistance (R6) and a twelfth capacitor (C12). The elements included in the high band receiving circuit 250 are not necessarily limited thereto.

One end of the twelfth capacitor (C12) is connected to the other end on the input/output side (high frequency signal input/output terminal (HB IN/OUT)) of the diplexer 110. The other end of the twelfth capacitor (C12) is connected to a ground (GND).

One end of the sixth inductor (L6) is connected to a contact point of the other end on the input/output side (high frequency signal input/output terminal (HB IN/OUT)) of the diplexer 110 and one end of the twelfth capacitor (C12). The other end of the sixth inductor (L6) is connected to a contact point of the current input terminal of the third switch (TR3) and the input terminal of the second electrostatic discharge circuit (ESD2).

The current input terminal of the third switch (TR3) is connected to a contact point of the other end of the sixth inductor (L6) and the input terminal of the second electrostatic discharge circuit (ESD2). The input terminal of the third switch (TR3) is connected to one end of the sixth resistance (R6). The current lead-out terminal of the third switch (TR3) is connected to a ground (GND).

One end of the sixth resistance (R6) is connected to the input terminal of the third switch (TR3). The other end of the sixth resistance (R6) is connected to the enable terminal of the high band transmitting terminal (HB-TX_EN).

The input terminal of the second electrostatic discharge circuit (ESD2) is connected to a contact point of the other end of the sixth inductor (L6) and one end of the eleventh capacitor (C11). The output terminal of the second electrostatic discharge circuit (ESD2) is connected to a ground (GND).

The second electrostatic discharge circuit (ESD2) includes a third diode (D3) and a fourth diode (D4).

The input terminal of the electrostatic discharge circuit (ESD2) is connected to a contact point of an anode of the third diode (D3) and a cathode of the fourth diode (D4). The anode of the third diode (D3) is connected to the cathode of the fourth diode (D4). The cathode of the third diode (D3) is connected to the anode of the fourth diode (D4).

The output terminal of the second electrostatic discharge circuit (ESD2) is connected to a contact point of the cathode of the third diode (D3) and the anode of the fourth diode (D4). The anode of the fourth diode (D4) is connected to the cathode of the third diode (D3). The cathode of the fourth diode (D4) is connected to the anode of the third diode (D3).

One end of the fifth resistance (R5) is connected to a contact point of the input terminal of the second electrostatic discharge circuit (ESD2) and one end of the eleventh capacitor (C11). The other end of the fifth resistance (R5) is connected to a ground (GND).

One end of the eleventh capacitor (C11) is connected to a contact point of the input terminal of the second electrostatic discharge circuit (ESD2) and one end of the fifth resistance (R5). The other end of the eleventh capacitor (C11) is connected to the input terminal of the HB-LNA 134.

Figure 3:
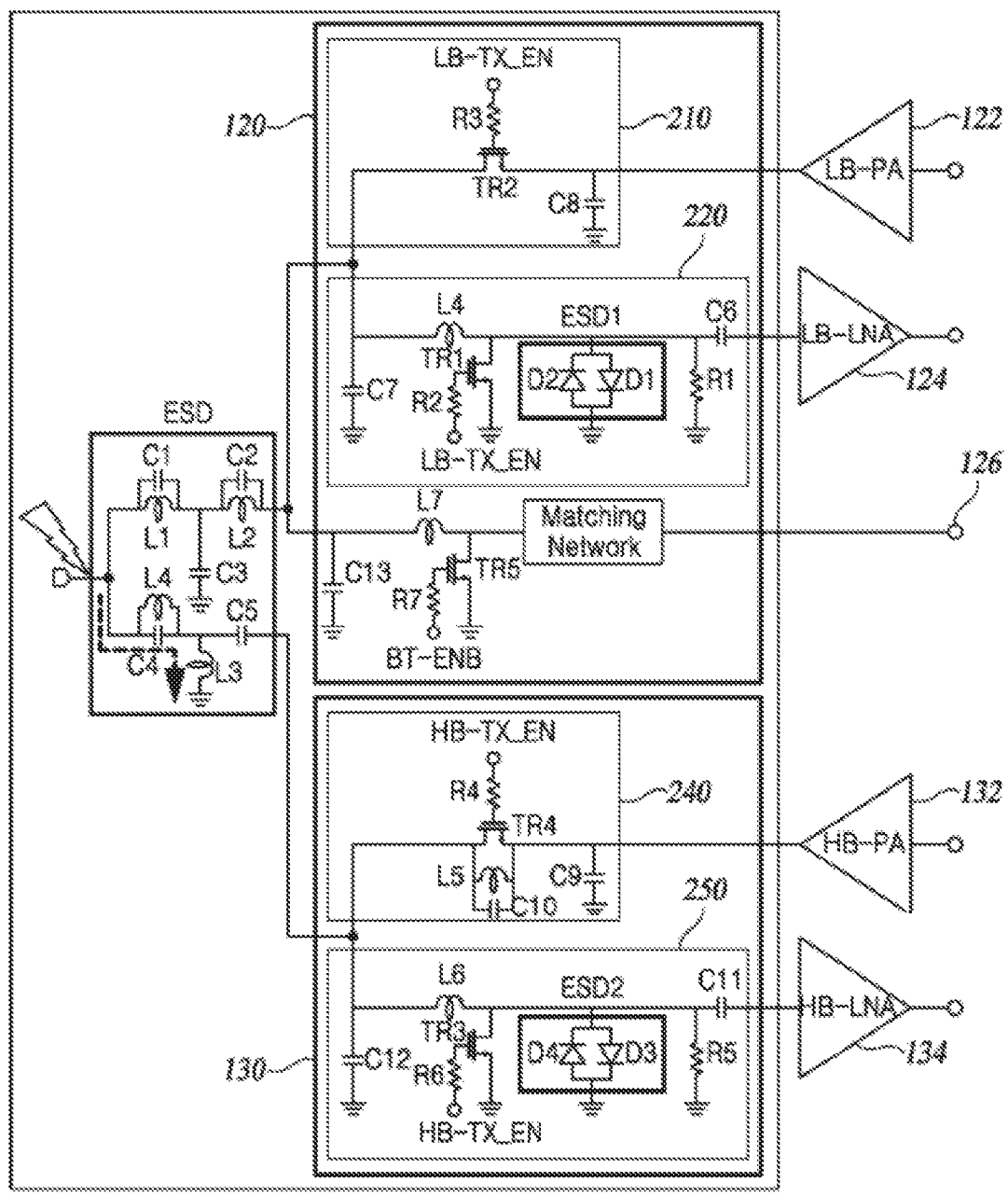
FIG. 3 is a circuit diagram illustrating a diplexer, according to an embodiment of the disclosure.

FIG. 3 is a circuit diagram illustrating a diplexer, according to an embodiment of the disclosure.

The diplexer 110 according to an embodiment of the disclosure includes a low band filter 410 and a high band filter 420. The elements included in the diplexer 110 are not necessarily limited thereto.

The diplexer 110 illustrated in FIG. 3 further includes a notch filter function and an ESD protection function as well as general diplexer functions.

The diplexer 110 includes ESD protection and thus may, as illustrated in FIG. 3, remove an ESD diode from the low band RF switch 120 and high band RF switch 130 connected to the diplexer 110.

The low band filter 410 according to an embodiment of the disclosure includes a first capacitor (C1), a second capacitor (C2), a third capacitor (C3), a first inductor (L1) and a second inductor (L2).

The low band filter 410 according to an embodiment of the disclosure includes a first capacitor (C1), a second capacitor (C2), a third capacitor (C3), a first inductor (L1) and a second inductor (L2) as elements. The low band filter 410 includes a low pass filter (LPF) 412, a first high band stop filter (BSF) 414 and a second high band stop filter (BSF) 416. The elements included in the low band filter 410 are not necessarily limited thereto.

The low pass filter (LPF) 412 passes only a low band signal from among signals flowing between the antenna (ANT) and the low frequency signal input/output terminal (LB IN/OUT).

The low pass filter (LPF) 412 includes a first inductor (L1), a second inductor (L2) and a third capacitor (C3).

One end of the first inductor (L1) is connected to the antenna (ANT). The other end of the first inductor (L1) is connected to one end of the second inductor (L2).

One end of the second inductor (L2) is connected to the other end of the first inductor (L1). The other end of the second inductor (L2) is connected to the low frequency signal input/output terminal (LB IN/OUT).

One end of the third capacitor (C3) is connected to a contact point of the other end of the first inductor (L1) and one end of the second inductor (L2). The other end of the third capacitor (C3) is connected to a ground (GND).

The first high band stop filter (BSF) 414 and the second high band stop filter (BSF) 416 are connected between the antenna (ANT) and the low pass filter (LPF) 412.

The first high band stop filter (BSF) 414 and the second high band stop filter (BSF) 416 share a current inducing element (the first inductor (L1) and the second inductor (L2) within the low pass filter (LPF) 412), and block a specific preset high band signal from among signals input to a low frequency path.

The first high band stop filter (BSF) 414 includes a first capacitor (C1) and a first inductor (L1).

One end of the first inductor (L1) is connected to a contact point of the antenna (ANT) and one end of the first capacitor (C1). The other end of the first inductor (L1) is connected to a contact point of the other end of the first capacitor (C1) and one end of the second inductor (L2).

One end of the first capacitor (C1) is connected to one end of the first inductor (L1). The other end of the first capacitor (C1) is connected to the other end of the first inductor (L1).

The second high band stop filter (BSF) 416 includes a second capacitor (C2) and a second inductor (L2).

One end of the second inductor (L2) is connected to the other end of the first inductor (L1). The other end of the second inductor (L2) is connected to the low frequency signal input/output terminal (LB IN/OUT).

One end of the second capacitor (C2) is connected to one end of the second inductor (L2). The other end of the second capacitor (C2) is connected to the other end of the second inductor (L2).

The high band filter 420 according to an embodiment of the disclosure includes a fourth capacitor (C4), a fifth capacitor (C5), a third inductor (L3) and a fourth inductor (L4) as elements. The high band filter 420 includes a high pass filter (HPF) 422, a low band stop filter (BSF) 424 and an electrostatic discharge (ESD) protection circuit 426. The elements included in the high band filter 420 are not necessarily limited thereto.

The high pass filter (HPF) 422 passes only a high band signal from among signals flowing between the antenna (ANT) and the high frequency signal input/output terminal (HB IN/OUT). The high pass filter (HPF) 422 includes a fourth capacitor (C4), a fifth capacitor (C5) and a third inductor (L3).

One end of the fourth capacitor (C4) is connected to the antenna (ANT). The other end of the fourth capacitor (C4) is connected to one end of the fifth capacitor (C5).

One end of the fifth capacitor (C5) is connected to the other end of the fourth capacitor (C4). The other end of the fifth capacitor (C5) is connected to the high frequency signal input/output terminal (HB IN/OUT).

One end of the third inductor (L3) is connected to a contact point of the other end of the fourth capacitor (C4) and one end of the fifth capacitor (C5). The other end of the third inductor (L3) is connected to a ground (GND).

The low band stop filter (BSF) 424 is connected between the antenna (ANT) and the high pass filter (HPF) 422. The low band stop filter (BSF) 424 shares any one (the fourth capacitor (C4)) from among charge/discharge elements within the high pass filter (HPF), and blocks a specific preset low band signal from among signals input to a high frequency path. The low band stop filter (BSF) 424 includes a fourth capacitor (C4) and a fourth inductor (L4).

One end of the fourth capacitor (C4) is connected to a contact point of the antenna (ANT) and one end of the fourth inductor (L4). The other end of the fourth capacitor (C4) is connected to the other end of the fourth inductor (L4).

One end of the fourth inductor (L4) is connected to one end of the fourth capacitor (C4). The other end of the fourth inductor (L4) is connected to the other end of the fourth capacitor (C4).

The electrostatic discharge (ESD) protection circuit 426 is connected between the high pass filter (HPF) 422 and the low band stop filter (BSF) 424. The electrostatic discharge (ESD) protection circuit 426 discharges static electricity input to a high frequency path to an electrostatic discharge protection path formed by sharing a current inducing element (the fourth inductor (L4)) within the low band stop filter (BSF) and a current inducing element (the third inductor (L3)) within the high pass filter (HPF). The electrostatic discharge (ESD) protection circuit 426 includes a third inductor (L3) and a fourth inductor (L4).

One end of the fourth inductor (L4) is connected to the antenna (ANT). The other end of the fourth inductor (L4) is connected to one end of the third inductor (L3).

One end of the third inductor (L3) is connected to the other end of the fourth inductor (L4). The other end of the third inductor (L3) is connected to a ground (GND).

The low band RF switch 120 illustrated in FIG. 3 includes a low band transmitting circuit 210, a low band receiving circuit 220 and a Bluetooth path.

The low band transmitting circuit 210 includes a third resistance (R3), a second switch (TR2) and an eighth capacitor (C8).

One end of the third resistance (R3) is connected to an enable terminal of a low band transmitting terminal (LB-TX_EN). The other end of the third resistance (R3) is connected to an input terminal of the second switch (TR2).

A current input terminal of the second switch (TR2) is connected to one end on the input/output side (low frequency signal input/output terminal (LB IN/OUT)) of the diplexer 110. An input terminal of the second switch (TR2) is connected to the other end of the third resistance (R3). A current lead-out terminal of the second switch (TR2) is connected to a contact point of one end of the eighth capacitor (C8) and the output terminal of the LB-PA 122.

One end of the eighth capacitor (C8) is connected to a contact point of the current lead-out terminal of the second switch (TR2) and the output terminal of the LB-PA 122. The other end of the eighth capacitor (C8) is connected to a ground (GND).

The low band receiving circuit 220 includes a sixth capacitor (C6), a first resistance (R1), a first switch (TR1), a second resistance (R2), a fourth inductor (L4) and a seventh capacitor (C7). The low band receiving circuit 220 does not include a first electrostatic discharge circuit (ESD1).

One end of the seventh capacitor (C7) is connected to one end on the input/output side (low frequency signal input/output terminal (LB IN/OUT)) of the diplexer 110. The other end of the seventh capacitor (C7) is connected to a ground (GND).

One end of the fourth inductor (L4) is connected to a contact point of one end on the input/output side (low frequency signal input/output terminal (LB IN/OUT)) of the diplexer 110 and one end of the seventh capacitor (C7). The other end of the fourth inductor (L4) is connected to a contact point of the current input terminal of the first switch (TR1) and one end of the sixth capacitor (C6).

The current input terminal of the first switch (TR1) is connected to a contact point of the other end of the fourth inductor (L4) and one end of the sixth capacitor (C6). The input terminal of the first switch (TR1) is connected to one end of the second resistance (R2). The current lead-out terminal of the first switch (TR1) is connected to a ground (GND).

One end of the second resistance (R2) is connected to the input terminal of the first switch (TR1). The other end of the second resistance (R2) is connected to an enable terminal of the low band transmitting terminal (LB-TX_EN).

One end of the first resistance (R1) is connected to a contact point of the other end of the fourth inductor (L4) and one end of the sixth capacitor (C6). The other end of the first resistance (R1) is connected to a ground (GND).

One end of the sixth capacitor (C6) is connected to a contact point of the other end of the fourth inductor (L4) and one end of the first resistance (R1). The other end of the sixth capacitor (C6) is connected to the input terminal of the LB-LNA 124.

One end of the Bluetooth path is connected to one end on the input/output side (low frequency signal input/output terminal (LB IN/OUT)) of the diplexer 110. The other end of the Bluetooth path is connected to the Bluetooth input/output terminal 126.

The Bluetooth path includes a 13th capacitor (C13), a seventh inductor (L7), a fifth switch (TR5), a seventh resistance (R7) and a matching network circuit.

One end of the 13th capacitor (C13) is connected to one end on the input/output side (low frequency signal input/output terminal (LB IN/OUT)) of the diplexer 110. The other end of the 13th capacitor (C13) is connected to a ground (GND).

One end of the seventh inductor (L7) is connected to a contact point of one end on the input/output side (low frequency signal input/output terminal (LB IN/OUT)) of the diplexer 110 and one end of the 13th capacitor (C13). The other end of the seventh inductor (L7) is connected to a contact point of the current input terminal of the fifth switch (TR5) and one end of the matching network circuit.

The current input terminal of the fifth switch (TR5) is connected to a contact point of the other end of the seventh inductor (L7) and one end of the matching network circuit. The input terminal of the fifth switch (TR5) is connected to one end of the seventh resistance (R7). The current lead-out terminal of the fifth switch (TR5) is connected to a ground (GND).

One end of the seventh resistance (R7) is connected to the input terminal of the fifth switch (TR5). The other end of the seventh resistance (R7) is connected to a Bluetooth enable terminal (BT_EN).

One end of the matching network circuit is connected to a contact point of the other end of the seventh inductor (L7) and the current input terminal of the fifth switch (TR5). The other end of the matching network circuit is connected to the Bluetooth input/output terminal 126.

The high band RF switch 130 illustrated in FIG. 3 includes a high band transmitting circuit 240 and a high band receiving circuit 250.

The high band transmitting circuit 240 includes a ninth capacitor (C9), a fifth inductor (L5), a tenth capacitor (C10), a fourth switch (TR4) and a fourth resistance (R4).

One end of the fourth resistance (R4) is connected to an enable terminal of the high band transmitting terminal (HB-TX_EN). The other end of the fourth resistance (R4) is connected to an input terminal of the fourth switch (TR4).

A current input terminal of the fourth switch (TR4) is connected to the other end on the input/output side (high frequency signal input/output terminal (HB IN/OUT)) of the diplexer 110. An input terminal of the fourth switch (TR4) is connected to the other end of the fourth resistance (R4). The current lead-out terminal of the fourth switch (TR4) is connected to the output terminal of the HB-PA 132.

One end of the fifth inductor (L5) is connected to the current input terminal of the fourth switch (TR4). The other end of the fifth inductor (L5) is connected to the current lead-out terminal of the fourth switch (TR4).

One end of the tenth capacitor (C10) is connected to one end of the fifth inductor (L5). The other end of the tenth capacitor (C10) is connected to the other end of the fifth inductor (L5).

One end of the ninth capacitor (C9) is connected to a contact point of the current lead-out terminal of the fourth switch (TR4) and the output terminal of the HB-PA 132. The other end of the ninth capacitor (C9) is connected to a ground (GND).

The high band receiving circuit 250 includes an eleventh capacitor C11, a fifth resistance (R5), a sixth inductor (L6), a third switch (TR3), a sixth resistance (R6) and a twelfth capacitor (C12). The high band receiving circuit 250 does not include a second electrostatic discharge circuit (ESD2).

One end of the twelfth capacitor (C12) is connected to the other end on the input/output side (high frequency signal input/output terminal (HB IN/OUT)) of the diplexer 110. The other end of the twelfth capacitor (C12) is connected to a ground (GND).

One end of the sixth inductor (L6) is connected to a contact point of the other end on the input/output side (high frequency signal input/output terminal (HB IN/OUT)) of the diplexer 110 and one end of the twelfth capacitor (C12). The other end of the sixth inductor (L6) is connected to a contact point of the current input terminal of the third switch (TR3) and one end of the eleventh capacitor (C11).

The current input terminal of the third switch (TR3) is connected to a contact point of the other end of the sixth inductor (L6) and one end of the eleventh capacitor (C11). The input terminal of the third switch (TR3) is connected to one end of the sixth resistance (R6). The current lead-out terminal of the third switch (TR3) is connected to a ground (GND).

One end of the sixth resistance (R6) is connected to the input terminal of the third switch (TR3). The other end of the sixth resistance (R6) is connected to the enable terminal of the high band transmitting terminal (HB-TX_EN).

One end of the fifth resistance (R5) is connected to a contact point of the other end of the sixth inductor (L6) and one end of the eleventh capacitor (C11). The other end of the fifth resistance (R5) is connected to a ground (GND).

One end of the eleventh capacitor (C11) is connected to a contact point of the other end of the sixth inductor (L6) and one end of the fifth resistance (R5). The other end of the eleventh capacitor (C11) is connected to the input terminal of the HB-LNA 134.

Figure 4:
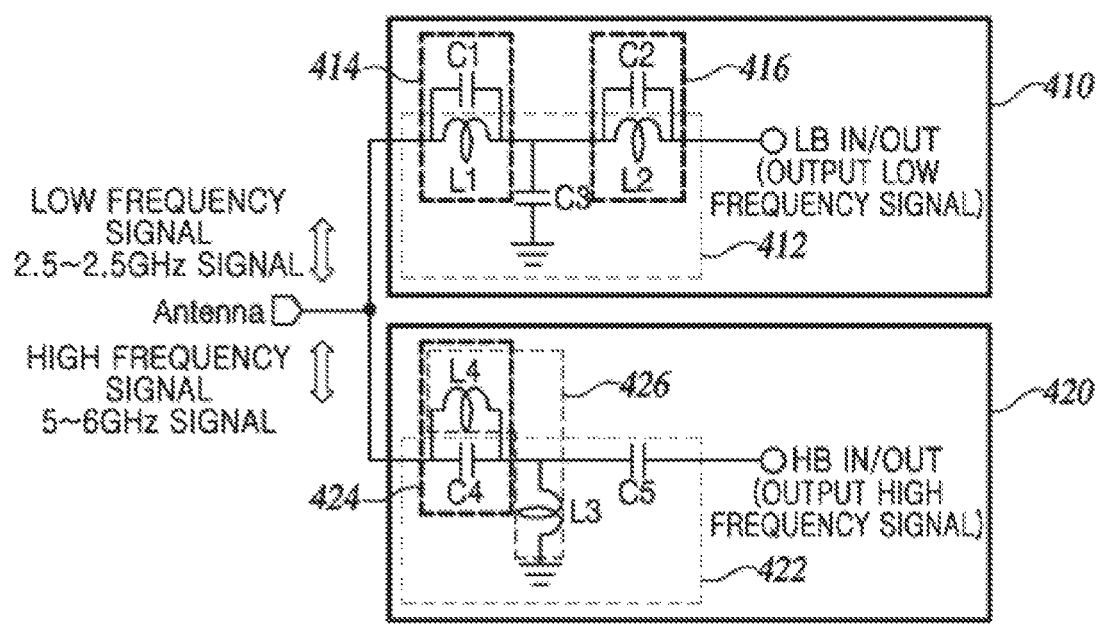
FIG. 4 is a diagram provided to explain an operation of a diplexer, according to an embodiment of the disclosure.

FIG. 4 is a diagram provided to explain an operation of a diplexer, according to an embodiment of the disclosure.

①. The low pass filter (LPF) 412 passes only a signal of a band less than or equal to 2.5 GHz from among signals input to a low frequency path.

②. The first high band stop filter (BSF) 414 filters out a high frequency band of 5 to 5.5 GHz so that no high band signal is input to the low frequency path.

The second high band stop filter (BSF) 416 blocks a high frequency band of 5.5 to 6 GHz so that no high band signal is input to the low frequency path.

The first high band stop filter (BSF) 414 and the second high band stop filter (BSF) 416 assist the low pass filter (LPF) 412 and prevent input of unnecessary high band signals.

When a high frequency signal is input from an antenna (ANT) terminal or output to the antenna (ANT) terminal, the first high band stop filter (BSF) 414 and the second high band stop filter (BSF) 416 allow a high impedance to be formed on the low frequency path so that a high frequency signal does not flow through the low frequency path, thereby minimizing the signal loss of the high frequency path.

③. The high pass filter (HPF) 422 passes only a signal of a band greater than or equal to 5 GHz from among signals input to the high frequency path.

④. The low band stop filter (BSF) 424 blocks a low frequency band of 2.4 to 2.5 GHz so that no low band signal from among the signals input to the high frequency path is input to the high frequency path.

The low band stop filter (BSF) 424 assists the high pass filter (HPF) 422 and blocks input of unnecessary low band signals.

When a low frequency signal is input from the antenna (ANT) terminal or output to the antenna (ANT) terminal, the low band stop filter (BSF) 424 allows a high impedance to be formed on the high frequency path so that a low frequency signal, input to the low frequency path, does not flow through the high frequency path, thereby minimizing the signal loss of the low frequency path.

⑤. The electrostatic discharge protection circuit (ESD) 426, when an electrostatic discharge is input from the antenna (ANT), forms an electrostatic discharge protection path leading to "the antenna (ANT)→the fourth inductor (L4)→the third inductor (L3)→ground (GND)" so that a current escapes to a ground (GND) so that the electrostatic discharge escapes to the ground (GND), thereby preventing a circuit damage due to the electrostatic discharge.

Figure 5:
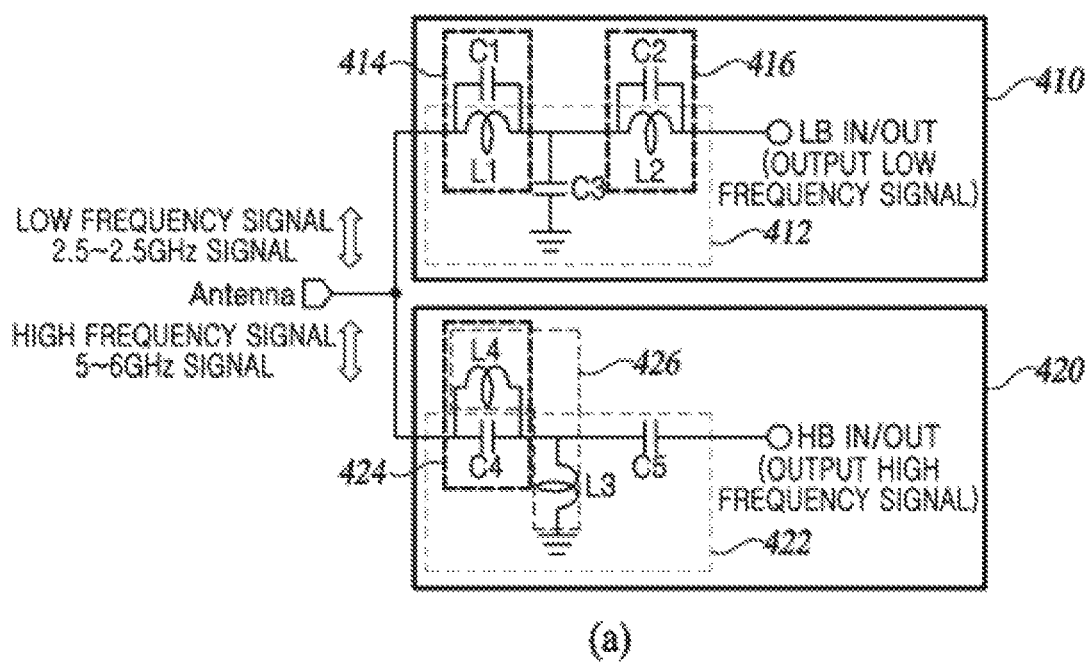
FIG. 5 is a diagram illustrating a gain curve of a diplexer, according to an embodiment of the disclosure.
Figure 5:
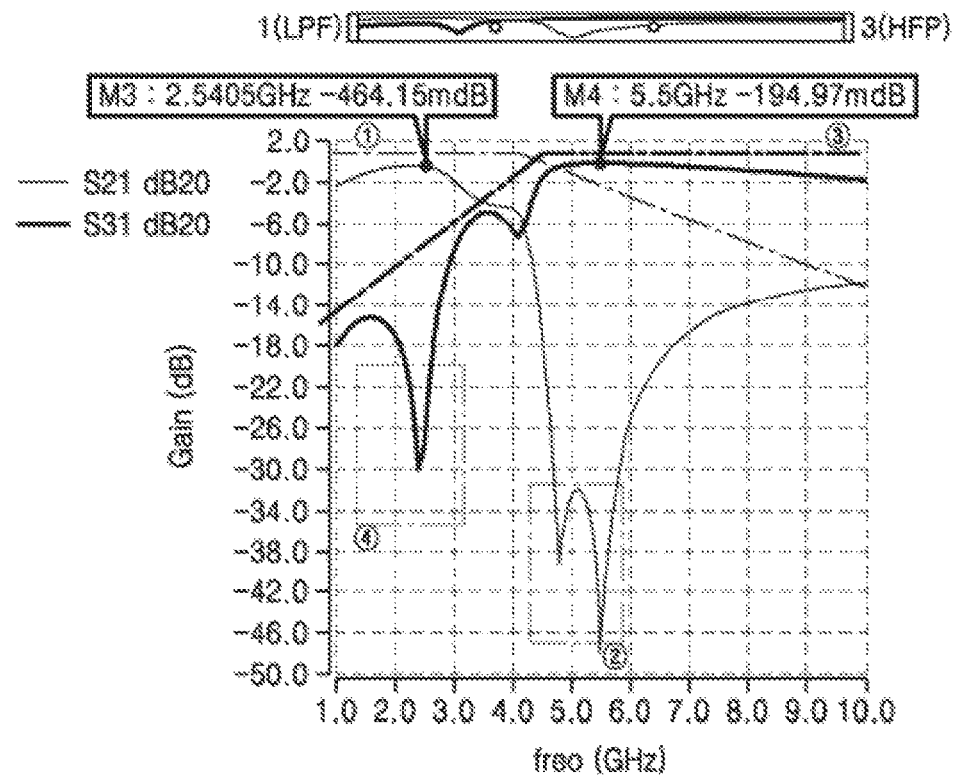

FIG. 5 is a diagram illustrating a gain curve of a diplexer, according to an embodiment of the disclosure.

The low pass filter (LPF) 412 illustrated in section (a) of FIG. 5 passes only a signal of a band less than or equal to 2.5 GHz from among signals input from one antenna (ANT), and a gain graph of a signal passing through the low pass filter (LPF) 412 is as illustrated in ① of section (b) of FIG. 5.

The first high band stop filter (BSF) 414 and second high band stop filter (BSF) 416 illustrated in section (a) of FIG. 5 block a signal of a band of 5 to 6 GHz from among signals input from one antenna (ANT), and a gain graph of a signal blocked by the second high band stop filter (BSF) 416 is as illustrated in ② of section (b) of FIG. 5.

The high pass filter (HPF) 422 illustrated in section (a) of FIG. 5 passes only a signal of a band greater than or equal to 5 GHz from among signals input from one antenna (ANT), and a gain graph of a signal passing through the high pass filter (HPF) 422 is as illustrated in ③ of section (b) of FIG. 5.

The low band stop filter (BSF) 424 illustrated in section (a) of FIG. 5 blocks a signal of between 2.4 to 2.5 GHz from among signals input from one antenna (ANT), and a gain graph of a signal blocked by the low band stop filter (BSF) 424 is as illustrated in ④ of section (b) of FIG. 5.

A low frequency path by the low band filter 410 included in the diplexer 110 and a gain curve (2.4 to 2.5 GHz) from the antenna (ANT) to the low frequency signal input/output terminal (LB IN/OUT) are as illustrated in the ① and ②, respectively.

A high frequency path by the high band filter 420 included in the diplexer 110 and a gain curve (5 to 6 GHz) from the antenna (ANT) to the high frequency signal input/output terminal (HB IN/OUT) are as illustrated in the ③ and ④, respectively.

Although embodiments of the disclosure have been illustrated and described, it should be understood that the disclosure is not limited to the disclosed embodiments and may be variously changed without departing from the spirit and the scope of the disclosure. While the disclosure has been shown and described with reference to various embodiments thereof, it will be understood by those skilled in the art that various changes in form and details may be made therein without departing from the spirit and scope of the disclosure as defined by the appended claims and their equivalents. While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A diplexer, comprising:
a low pass filter (LPF) to pass only a preset low band signal from among signals input from an antenna (ANT) to a low frequency path, and output the passed low band signal to a low frequency signal input/output terminal (LB IN/OUT);
a high band stop filter (BSF) connected between the antenna (ANT) and the low pass filter (LPF), and sharing a current inducing element within the low pass filter (LPF) and blocking a specific preset high band signal from among signals input to the low frequency path;
a high pass filter (HPF) to pass only a preset high band signal from among signals input from the antenna (ANT) to a high frequency path, and output the passed high band signal to a high frequency signal input/output terminal (HB IN/OUT);
a low band stop filter (BSF) connected between the antenna (ANT) and the high pass filter (HPF), and sharing any one of charge/discharge elements within the high pass filter (HPF) and blocking a specific preset low band signal from among signals input to the high frequency path; and
an electrostatic discharge protection circuit (ESD) connected between the high pass filter (HPF) and the low band stop filter (BSF), and discharging an electrostatic discharge input to the high frequency path to an electrostatic discharge protection path formed by sharing a current inducing element within the low band stop filter (BSF) and a current inducing element within the high pass filter (HPF),
wherein the low pass filter (LPF) includes a first inductor (L1), a second inductor (L2) and a third capacitor (C3),
wherein one end of the first inductor (L1) is connected to the antenna (ANT) and the other end of the first inductor (L1) is connected to one end of the second inductor (L2),
wherein the other end of the second inductor (L2) is connected to the low frequency signal input/output terminal (LB IN/OUT), and
wherein one end of the third capacitor (C3) is connected to a contact point of the other end of the first inductor (L1) and the one end of the second inductor (L2) and the other end of the third capacitor (C3) is connected to a ground (GND).

2. The diplexer as claimed in claim 1, wherein the high band stop filter (BSF) includes a first high band stop filter (BSF) and a second high band stop filter (BSF),
wherein one end of the first high band stop filter (BSF) is connected to the antenna (ANT) and the other end of the first high band stop filter (BSF) is connected to one end of the second high band stop filter (BSF), and
wherein the other end of the second high band stop filter (BSF) is connected to the low frequency signal input/output terminal (LB IN/OUT).

3. The diplexer as claimed in claim 2, wherein the first high band stop filter (BSF) includes a first capacitor (C1) and the first inductor (L1),
wherein one end of the first capacitor (C1) is connected to the one end of the first inductor (L1) and the other end of the first capacitor (C1) is connected to the other end of the first inductor (L1), and wherein the one end of the first inductor (L1) is connected to a contact point of the antenna (ANT) and the one end of the first capacitor (C1) and the other end of the first inductor (L1) is connected to a contact point of the other end of the first capacitor (C1) and the one end of the second inductor (L2).

4. The diplexer as claimed in claim 3, wherein the second high band stop filter (BSF) includes a second capacitor (C2) and the second inductor (L2),
wherein one end of the second capacitor (C2) is connected to the one end of the second inductor (L2) and the other end of the second capacitor (C2) is connected to the other end of the second inductor (L2),
wherein the one end of the second inductor (L2) is connected to a contact point of the other end of the first inductor (L1) and the one end of the third capacitor (C3), and
wherein the other end of the second inductor (L2) is connected to a contact point of the other end of the second capacitor (C2) and the low frequency signal input/output terminal (LB IN/OUT).

5. The diplexer as claimed in claim 4, wherein the low pass filter (LPF) passes only a signal of less than or equal to a preset low threshold band from among signals input from the antenna (ANT),
wherein the first high band stop filter (BSF) blocks a signal of a first high threshold band from among preset high bands from among the signals input from the antenna (ANT),
wherein the second high band stop filter (BSF) blocks a signal of a second high threshold band from among preset high bands from among the signals input from the antenna (ANT), and
wherein a high frequency signal from among the signals input from the antenna (ANT) is not input to the low frequency path and is induced to be input to the high frequency path so that a signal loss of the high frequency path is minimized, and the high frequency signal from among signals output from a high band filter to the antenna (ANT) is not input to the low frequency path and is induced to be output to the antenna (ANT) so that a loss of the high frequency signal is minimized.

6. The diplexer as claimed in claim 1, wherein the high pass filter (HPF) includes a fourth capacitor (C4), a fifth capacitor (C5) and a third inductor (L3),
wherein one end of the fourth capacitor (C4) is connected to the antenna (ANT) and the other end of the fourth capacitor (C4) is connected to one end of the fifth capacitor (C5),
wherein the other end of the fifth capacitor (C5) is connected to the high frequency signal input/output terminal (HB IN/OUT), and
wherein one end of the third inductor (L3) is connected to a contact point of the other end of the fourth capacitor (C4) and the one end of the fifth capacitor (C5) and the other end of the third inductor (L3) is connected to a ground (GND).

7. The diplexer as claimed in claim 6, wherein the low band stop filter (BSF) includes the fourth capacitor (C4) and a fourth inductor (L4),
wherein the one end of the fourth capacitor (C4) is connected to a contact point of the antenna (ANT) and one end of the fourth inductor (L4) and the other end of the fourth capacitor (C4) is connected to a contact point of the other end of the fourth inductor (L4) and the one end of the third inductor (L3), and wherein the one end of the fourth inductor (L4) is connected to a contact point of the one end of the fourth capacitor (C4) and the antenna (ANT) and the other end of the fourth inductor (L4) is connected to the other end of the fourth capacitor (C4).

8. The diplexer as claimed in claim 7, wherein the electrostatic discharge protection circuit (ESD) includes the third inductor (L3) and the fourth inductor (L4),
wherein the one end of the fourth inductor (L4) is connected to the antenna (ANT) and the other end of the fourth inductor (L4) is connected to the one end of the third inductor (L3),
wherein the one end of the third inductor (L3) is connected to the other end of the fourth inductor (L4) and the other end of the third inductor (L3) is connected to the ground (GND), and
wherein based on an electrostatic discharge being input from the antenna (ANT), the electrostatic discharge protection path leading from the antenna (ANT), the fourth inductor (L4), the third inductor (L3) to the ground (GND) is formed and the electrostatic discharge is discharged to the ground (GND).

9. The diplexer as claimed in claim 8, wherein the high pass filter (HPF) passes only a signal of greater than or equal to a preset high threshold band from among signals input from the antenna (ANT),
wherein the low band stop filter (BSF) filters out a signal of a preset low threshold band from among the signals input from the antenna (ANT), and
wherein a low frequency signal from among the signals input from the antenna (ANT) is not input to the high frequency path and is induced to be input to the low frequency path so that a signal loss of the low frequency path is minimized, and the low frequency signal from among signals output from a low band filter to the antenna (ANT) is not input to the high frequency path and is induced to be output to the antenna (ANT) so that a loss of the low frequency signal is minimized.

* * * * *